(12) United States Patent
Jai et al.

(10) Patent No.: US 12,295,171 B2
(45) Date of Patent: May 6, 2025

(54) DISPLAY DEVICE

(71) Applicant: AU Optronics (Kunshan) Co., Ltd., Kunshan (CN)

(72) Inventors: Pang-Ho Jai, Suzhou (CN); Hung-Che Cheng, Suzhou (CN); Wen-Chieh Chou, Suzhou (CN)

(73) Assignee: AU OPTRONICS (KUNSHAN) CO., LTD., Kunshan (CN)

( * ) Notice: Subject to any disclaimer, the term of this patent is extended or adjusted under 35 U.S.C. 154(b) by 232 days.

(21) Appl. No.: 17/433,708

(22) PCT Filed: May 25, 2020

(86) PCT No.: PCT/CN2020/092070
§ 371 (c)(1),
(2) Date: Aug. 25, 2021

(87) PCT Pub. No.: WO2021/184538
PCT Pub. Date: Sep. 23, 2021

(65) Prior Publication Data
US 2024/0213254 A1    Jun. 27, 2024

(30) Foreign Application Priority Data

Mar. 19, 2020 (CN) .......................... 202010179319.0

(51) Int. Cl.
*G02F 1/1345* (2006.01)
*H10D 86/40* (2025.01)
*H10D 86/60* (2025.01)
*H10H 29/14* (2025.01)

(52) U.S. Cl.
CPC .......... *H10D 86/60* (2025.01); *H10D 86/411* (2025.01); *H10D 86/441* (2025.01); *H10H 29/142* (2025.01)

(58) Field of Classification Search
CPC . H01L 27/1218; H01L 27/124; H01L 27/156; G02F 1/133512
See application file for complete search history.

(56) References Cited

U.S. PATENT DOCUMENTS

2020/0326578 A1* 10/2020 Liu .................. G02F 1/133512

FOREIGN PATENT DOCUMENTS

| CN | 102360137 A | 2/2012 |
|---|---|---|
| CN | 106125412 A | 11/2016 |

* cited by examiner

*Primary Examiner* — Abdul-Samad A Adediran
(74) *Attorney, Agent, or Firm* — WPAT, PC

(57) ABSTRACT

The invention provides a display device, comprising: a first substrate having a peripheral region and a display region, a plurality of pixel units disposed in the display region; a second metal layer electrically connected to the plurality of pixel units; a first planarization layer including a plurality of bump pad groups and a plurality of opening regions; a third metal layer having a position corresponding to the plurality of opening regions; a second substrate; a light shielding layer, a first color resist layer and a second planarization layer disposed on the second substrate; a second color resist layer; wherein in the display region, the second color resist layer is adjacent to the first color resist layer, and in the peripheral region, the second color resist layer and the first color resist layer are stacked, and a position of the second color resist layer corresponds to the plurality of opening regions.

19 Claims, 7 Drawing Sheets

DISPLAY DEVICE

BACKGROUND OF THE INVENTION

1. Field of the Invention

The invention relates to a display device, and particularly to a display device capable of improving display effect.

2. Related Art

With development of science and technology, touch display devices are widely applied to many electronic products, such as, mobile phones, tablet computers, watches, and the like.

The existing touch display devices are often made of a low temperature polysilicon process, and electrical connection between pixel units and a control circuit is achieved through fan out. Generally, a planarization layer (PL) is formed on an active element (TFT) array substrate of the touch display device, and when a third metal layer (M3) is introduced to transmit a touch signal and achieve effect of reducing a driving voltage, in a region where the third metal layer shall be formed within a large range, the way of hollowing out the planarization layer is often used, so bump pads cannot be formed in the corresponding region. As for the existing process, a thickness of the bump pad is about 5500 angstroms, and a thickness of the third metal layer is about 3700 angstroms. Therefore, a difference of height of about 1800 angstroms is produced between a region where the third metal layer is formed and a region where the third metal layer is not formed, such that the problem of uneven display is produced in the touch display device.

Therefore, how to better avoid occurrence of the difference of height in different regions of the display panel, reduce occurrence of phenomenon of uneven display, and improve display effect of the product is actually one of the problems to be solved.

SUMMARY OF THE INVENTION

The embodiments of the invention provide a display device, which can better avoid occurrence of the difference of height in different regions of the display panel, reduce occurrence of phenomenon of uneven display, and improve display effect of the product.

The display device in one embodiment of the invention comprises a first substrate having a peripheral region and a display region adjacent to each other, a plurality of pixel units disposed in the display region, arranged into multiple columns along a first direction, and arranged into multiple rows along a second direction, each of the pixel units having a thin film transistor; a second metal layer disposed on the first substrate, and electrically connected to the plurality of pixel units, respectively; a first planarization layer disposed on the first substrate, and covering the second metal layer, wherein the first planarization layer includes a plurality of bump pad groups, each having a plurality of bump pads, and a plurality of opening regions formed between adjacent of the plurality of bump pad groups; a third metal layer disposed in the peripheral region, having a position corresponding to the plurality of opening regions, and electrically connected to the second metal layer; a second substrate opposite to the first substrate; a light shielding layer disposed on the second substrate; a first color resist layer disposed on the light shielding layer; a second planarization layer disposed on the second substrate, and covering the first color resist layer; and a second color resist layer disposed on the second substrate; wherein in the display region, the second color resist layer is adjacent to the first color resist layer, and in the peripheral region, the second color resist layer and the first color resist layer are stacked, and a position of the second color resist layer corresponds to the plurality of opening regions of the first planarization layer.

The display device in another embodiment of the invention comprises a first substrate having a peripheral region and a display region adjacent to each other, a plurality of pixel units disposed in the display region, arranged into multiple columns along a first direction, and arranged into multiple rows along a second direction, each of the pixel units having a thin film transistor; a first planarization layer disposed on the first substrate, wherein the first planarization layer includes a plurality of bump pad groups, each having a plurality of bump pads, and a plurality of opening regions formed between adjacent of the plurality of bump pad groups; a first fan out structure disposed in the peripheral region, formed by stacking of a second metal layer and a third metal layer, and having a position corresponding to the plurality of opening regions; a second fan out structure disposed in the peripheral region, formed of the second metal layer, and disposed between adjacent of the plurality of opening regions; a second substrate opposite to the first substrate; a light shielding layer disposed on the second substrate; a plurality of first spacing structures disposed on the second substrate, each having a first color resist layer, a second color resist layer and a first bump structure stacked, and having a position corresponding to the first fan out structure; and a plurality of second spacing structures disposed on the second substrate, each having a first color resist layer and a second bump structure stacked, and having a position corresponding to the second fan out structure.

Hereinafter the invention is described in details with reference to the accompanying drawings and the detailed embodiments, but the invention is not limited thereto.

DETAILED EMBODIMENTS OF THE INVENTION

Figure 1A:
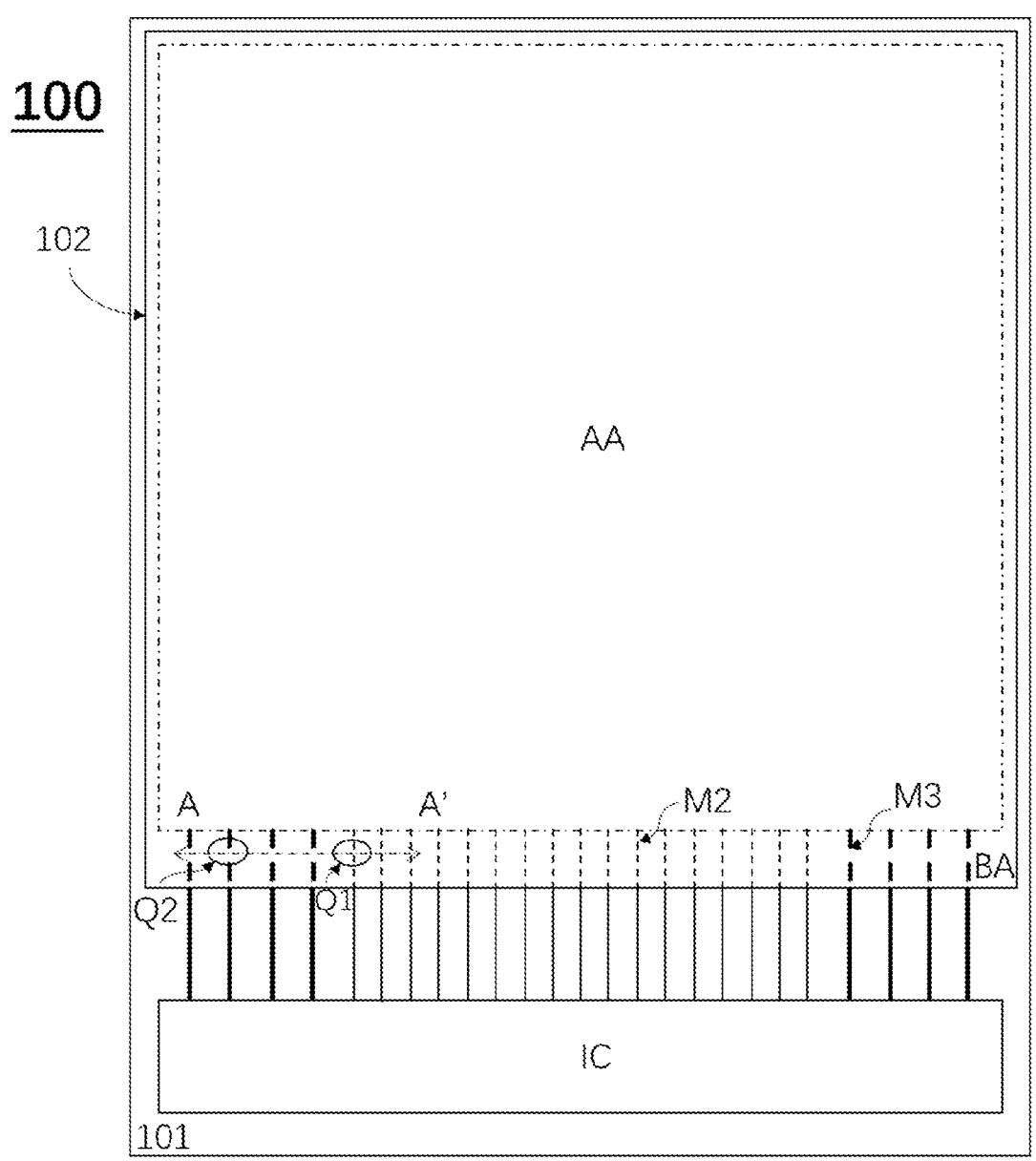
FIG. 1A is a structural diagram of a display device in one embodiment of the invention.
Figure 1B:
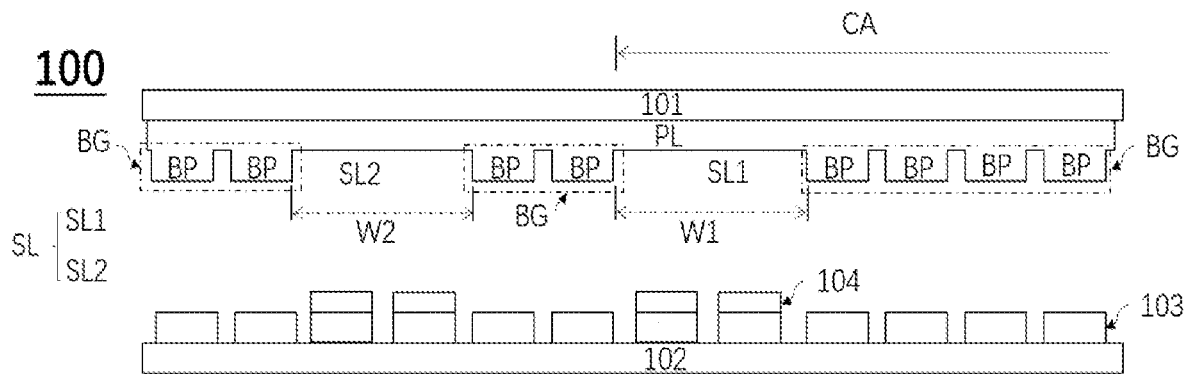
FIG. 1B is a sectional diagram along a section line A-A' in FIG. 1A.
Figure 1C:
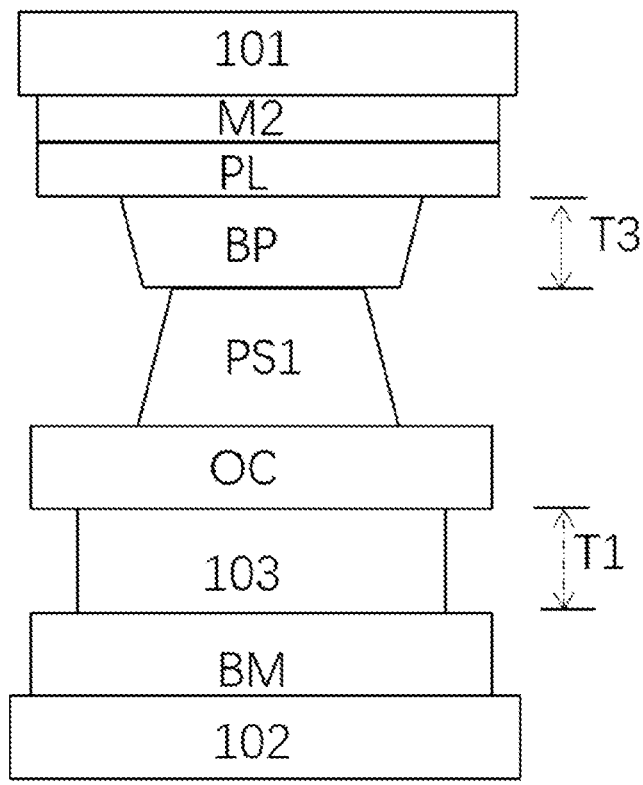
FIG. 1C is a sectional diagram of a region Q1 in FIG. 1A.
Figure 1D:
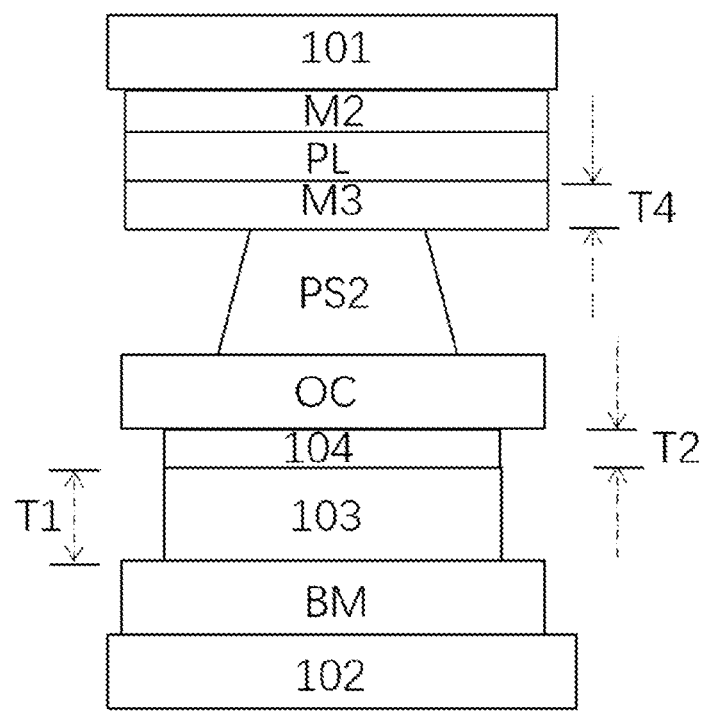
FIG. 1D is a sectional diagram of a region Q2 in FIG. 1A.

Hereinafter structure principle and working principle of the invention are described in details with reference to the accompanying drawings:

FIG. 1A is a structural diagram of a display device in one embodiment of the invention, FIG. 1B is a sectional diagram along a section line A-A' in FIG. 1A, FIG. 1C is a sectional diagram of a region Q1 in FIG. 1A, and FIG. 1D is a sectional diagram of a region Q2 in FIG. 1A. As shown in FIG. 1A, the display device 100 comprises a first substrate 101, and a second substrate 102 opposite to the first substrate 101. In this embodiment, the first substrate 101 has a display region AA and a peripheral region BA adjacent to each other, and a plurality of pixel units (not shown) are disposed in the display region AA. The plurality of pixel units are arranged in an array, arranged into multiple columns along a first direction (such as, X direction), and arranged into multiple rows along a second direction (such as, Y direction), and each of the pixel units is formed with at least one thin film transistor (not shown). A control circuit IC is disposed on the first substrate 101, and a second metal layer M2 and a third metal layer M3 are disposed on the first substrate 101, and coupled to the control circuit IC. Moreover, the second metal layer M2 is electrically connected to the plurality of pixel units, respectively, the third metal layer M3 is disposed in the peripheral region BA of the first substrate 101, and electrically connected to the second metal layer M2, and the second metal layer M2 and the third metal layer M3 transmit a control signal and data between the control circuit IC and the pixel units.

Further, referring to FIGS. 1B, 1C and 1D, a first planarization layer PL is disposed on the first substrate 101, and covers the second metal layer M2, and the third metal layer M3 is disposed on the first planarization layer PL. In other words, the second metal layer M2 is disposed between the first substrate 101 and the first planarization layer PL, and the first planarization layer PL is disposed between the second metal layer M2 and the third metal layer M3. Specifically, as shown in FIG. 1B, the first planarization layer PL has a plurality of bump pad groups (BG), and opening regions SL are formed between the adjacent two bump pad groups (BG). Moreover, each of the bump pad groups (BG) has a plurality of bump pads BP, and the number of bump pads BP in each of the bump pad groups BG is configured according to widths of the opening regions SL, but the invention is not limited thereto. It shall be noted that a position of the third metal layer M3 corresponds to the opening regions SL, i.e., disposing the third metal layer M3 only in the opening regions SL of the first planarization layer PL. As shown in FIGS. 1C and 1D, a light shielding layer BM is disposed on the second substrate 102, and a first color resist layer 103 and a second color resist layer 104 are disposed on the light shielding layer BM. In this embodiment, in a corresponding region of the display region AA, the second color resist layer 104 is adjacent to the first color resist layer 103, and in a corresponding region of the third metal layer M3, the second color resist layer 104 and the first color resist layer 103 are stacked, i.e., the second color resist layer 104 is disposed on the first color resist layer 103, as shown in FIG. 1B. Meanwhile, please also refer to FIGS. 1B, 1C and 1D, a second planarization layer OC is also disposed on the second substrate 102, and covers the first color resist layer 103 and the second color resist layer 104. In this embodiment, at a corresponding position of the bump pads BP, a first bump structure PS1 is disposed on the second planarization layer OC, as shown in FIG. 1B, and at a corresponding position of the third metal layer M3, a second bump structure PS2 is disposed on the second planarization layer OC, as shown in FIG. 1C.

In this embodiment, a projection of the first bump structure PS1 or the second bump structure PS2 on the second substrate 102 is a circle, and in order to better function to support, a projection of the first color resist layer 103 and the second color resist layer 104 corresponding to the second bump structure PS2 on the second substrate 102 is a circle or a square. Of course, projections of the first bump structure PS1, the second bump structure PS2, the first color resist layer 103 and the second color resist layer 104 on the second substrate 102 also may be other shapes, but the invention is not limited thereto. Accordingly, occurrence of a difference of height in different regions of the display panel can be avoided by stacking the first color resist layer 103 and the second color resist layer 104 at the corresponding position of the third metal layer M3.

Continuing as shown in FIGS. 1A and 1B, if extending to left and right sides along a center region CA of the display device 100, the plurality of opening regions SL of the first planarization layer PL can be divided into a first opening region SL1, a second opening region SL2 and a third opening region SL3 (not shown). The first opening region SL1 has a first width W1, the second opening region SL2 has a second width W2, and the third opening region has a third width W3. In this embodiment, the first width W1, the second width W2 and the third width W3 are the same, and the first width W1, the second width W2 or the third width W3 is less than or equal to 100 μm.

Continuing as shown in FIGS. 1C and 1D, the first color resist layer 103 has a first thickness T1, the second color resist layer 104 has a second thickness T2, the bump pads BP have a third thickness T3, and the third metal layer M3 has a fourth thickness. In this embodiment, in order to better achieve an object of the invention, in the peripheral region BA of the display device 100, the first thickness T1 of the first color resist layer 103 is greater than the second thickness T2 of the second color resist layer 104, and the second thickness T2 shall be the same as a difference between the third thickness T3 and the fourth thickness T4. The first color resist layer 103 and the second color resist layer 104 can be made of the same film layer, and also can be made of different film layers, but the invention is not limited thereto. Accordingly, the second color resist layer 104 can cancel the different of height in different regions of the display panel caused by different thicknesses between the bump pads BP and the third metal layer M3.

It shall be noted that FIG. 1B only exemplarily illustrates structures of the first planarization layer PL, the first color resist layer 103 and the second color resist layer 104 in the display device 100, and as for other film layers, reference can be made to FIGS. 1C and 1D.

Figure 2:
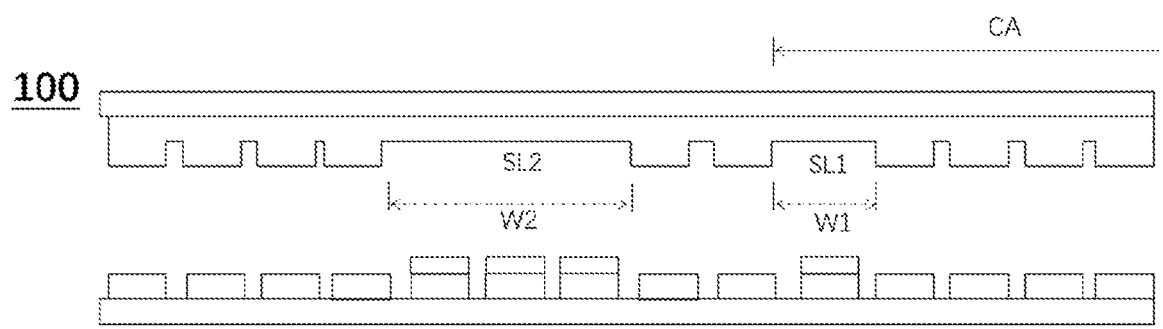
FIG. 2 is a structural diagram of a display device in another embodiment of the invention.

FIG. 2 is a structural diagram of a display device in another embodiment of the invention. As shown in FIG. 2, difference from the embodiment shown in FIGS. 1A to 1D lies in that, in this embodiment, if extending to left and right sides along the center region CA of the display device 100, the first width W1, the second width W2 and the third width W3 are increased progressively, i.e., the first width W1 is less than the second width W2, and the second width W2 is less than the third width W3, but it shall be satisfied that the first width W1, the second width W2 and the third width W3 are less than or equal to 100 μm. FIGS. 1B and 2 only illustrate schematic diagrams of a structure extending from the center region CA to one single side (i.e., the left side).

Figure 3A:
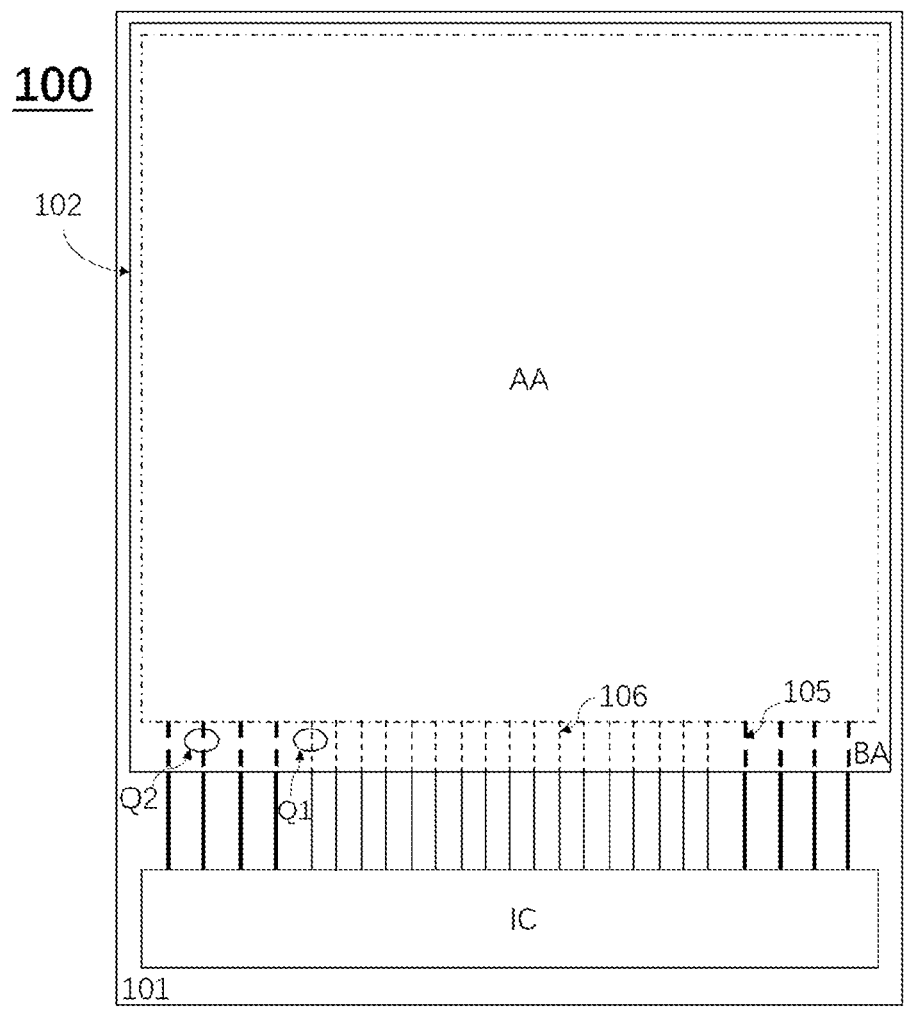
FIG. 3A is a structural diagram of a display device in still another embodiment of the invention.
Figure 3B:
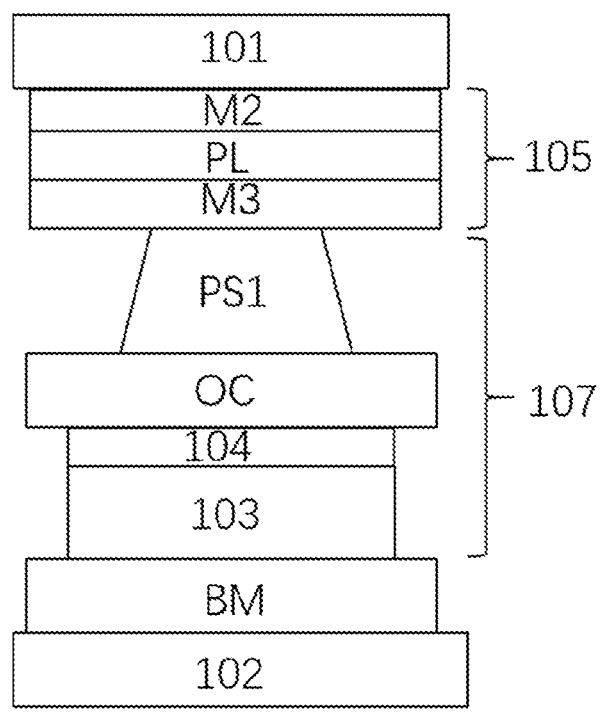
FIG. 3B is a sectional diagram of a region Q1 in FIG. 3A.
Figure 3C:
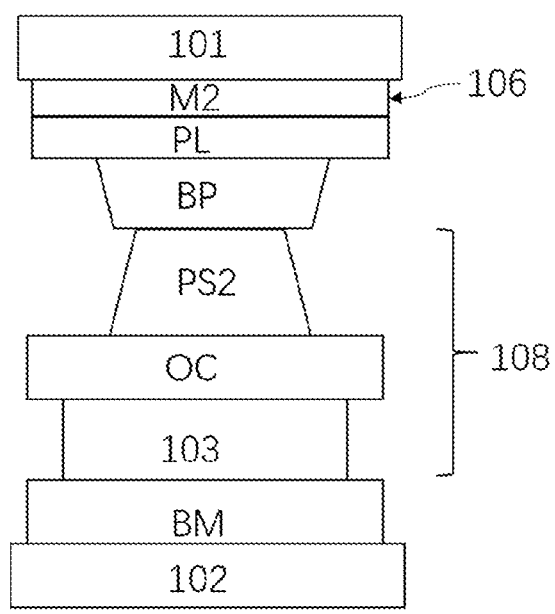
FIG. 3C is a sectional diagram of a region Q2 in FIG. 3A.

FIG. 3A is a structural diagram of a display device in still another embodiment of the invention, FIG. 3B is a sectional diagram of a region Q1 in FIG. 3A, and FIG. 3C is a sectional diagram of a region Q2 in FIG. 3A. As shown in FIG. 3A, the display device 100 comprises a first substrate 101, and a second substrate 102 opposite to the first substrate 101. In this embodiment, the first substrate 101 has a display region AA and a peripheral region BA adjacent to each other, and a plurality of pixel units (not shown) are disposed in the display region AA. The plurality of pixel units are arranged in an array, arranged into multiple columns along a first direction (such as, X direction), and arranged into multiple rows along a second direction (such as, Y direction), and each of the pixel units is formed with at least one thin film transistor (not shown). A control circuit IC is disposed on the first substrate 101, and a first fan out structure 105 and a second fan out structure 106 are disposed on the first substrate 101. The first fan out structure 105 and the second fan out structure 106 are coupled to the control circuit IC, and electrically connected to the plurality of pixel units, respectively, and transmission of a control signal and data between the control circuit IC and the pixel units are achieved through the first fan out structure 105 and the second fan out structure 106. As shown in FIGS. 3B and 3C, the first fan out structure 105 is formed by stacking of a second metal layer M2 and a third metal layer M3, and the second fan out structure 106 is formed of the second metal layer M2.

Similarly with the embodiment shown in FIGS. 1A to 1D, referring to FIG. 1B, in this embodiment, a first planarization layer PL is also disposed on the first substrate 101 of the display device 100, and covers the second metal layer M2, and the third metal layer M3 is disposed on the first planarization layer PL. In other words, the second metal layer M2 is disposed between the first substrate 101 and the first planarization layer PL, and the first planarization layer PL is disposed between the second metal layer M2 and the third metal layer M3. The first planarization layer PL has a plurality of bump pad groups BG, and opening regions SL are formed between the adjacent two bump pad groups BG. Moreover, each of the bump pad groups BG has a plurality of bump pads BP, and the number of bump pads BP in each of the bump pad groups BG is configured according to widths of the opening regions SL, but the invention is not limited thereto. In this embodiment, a position of the first fan out structure 105 corresponds to that of the opening regions SL.

As shown in FIGS. 3B and 3C, in this embodiment, a first spacing structure 107 and a second spacing structure 108 are disposed on the second substrate 102, respectively, wherein a position of the first spacing structure 107 corresponds to that of the first fan out structure 105, and a position of the second spacing structure 108 corresponds to that of the second fan out structure 106. Specifically, as shown in FIG. 3B, the first spacing structure 107 comprises a first color resist layer 103, a second color resist layer 104 and a first bump structure PS1 stacked, and the second spacing structure 108 comprises the first color resist layer 103 and a second bump structure PS2 stacked. Meanwhile, a second planarization layer OC is also disposed on the second substrate 102, and covers the first color resist layer 103 and the second color resist layer 104. In this embodiment, a projection of the first bump structure PS1 or the second bump structure PS2 on the second substrate 102 is a circle, and in order to better function to support, a projection of the first color resist layer 103 and the second color resist layer 104 corresponding to the second bump structure PS2 on the second substrate 102 is a circle or a square. Of course, projections of the first bump structure PS1, the second bump structure PS2, the first color resist layer 103 and the second color resist layer 104 on the second substrate 102 also may be other shapes, but the invention is not limited thereto. Accordingly, occurrence of a difference of height in different regions of the display panel can be avoided by stacking the first color resist layer 103 and the second color resist layer 104 at the corresponding position of the first fan out structure 105.

Similarly with the embodiment shown in FIGS. 1A to 1D or FIG. 2, in this embodiment, if extending to left and right sides along a center region CA of the display device 100, the plurality of opening regions SL of the first planarization layer PL can be divided into a first opening region SL1, a second opening region SL2 and a third opening region SL3. The first opening region SL1 has a first width W1, the second opening region SL2 has a second width W2, and the third opening region has a third width W3. In this embodiment, the first width W1, the second width W2 and the third width W3 may be the same, and it is also possible that the first width W1 is less than the second width W2, and the second width W2 is less than the third width W3, but it shall be satisfied that the first width W1, the second width W2 and the third width W3 are less than or equal to 100 μm.

Similarly with the embodiment shown in FIGS. 1A to 1D, in this embodiment, the first color resist layer 103 has a first thickness T1, the second color resist layer 104 has a second thickness T2, the bump pads BP have a third thickness T3, and the third metal layer M3 has a fourth thickness. In order to better achieve an object of the invention, in the peripheral region BA of the display device 100, the first thickness T1 of the first color resist layer 103 is greater than the second thickness T2 of the second color resist layer 104, and the second thickness T2 shall be the same as a difference between the third thickness T3 and the fourth thickness T4. The first color resist layer 103 and the second color resist layer 104 can be made of the same film layer, and also can be made of different film layers, but the invention is not limited thereto. Accordingly, the second color resist layer 104 can cancel the different of height in different regions of the display panel caused by different thicknesses between the bump pads BP and the third metal layer M3.

To sum up, according to the embodiments of the invention, since the difference of height in different regions of the display panel caused by different thicknesses between the bump pads and the third metal layer can be cancelled at the corresponding position of the third metal layer through the way of disposing the second color resist layer below the bump structures, occurrence of the difference of height in different regions of the display panel is better avoided, occurrence of phenomenon of uneven display is reduced, and display effect of the product is improved.

Of course, the invention also may have various other embodiments, and those skilled in the art shall make various corresponding modifications and variations without departing from spirit and essence of the invention, but these corresponding modifications and variations shall belong to the scope protected by the appended claims of the invention.

INDUSTRIAL PRACTICABILITY

Application of the display device of the invention has the following advantageous effects:
   capable of better avoiding occurrence of the difference of height in different regions of the display panel, reducing occurrence of phenomenon of uneven display, and improving display effect of the product.

What is claimed is:
1. A display device, comprising:
a first substrate having a peripheral region and a display region adjacent to each other, a plurality of pixel units disposed in the display region, arranged into multiple columns along a first direction, and arranged into multiple rows along a second direction, each of the pixel units having a thin film transistor;
a second metal layer disposed on the first substrate, and electrically connected to the plurality of pixel units, respectively;
a first planarization layer disposed on the first substrate, and covering the second metal layer, wherein the first planarization layer includes a plurality of bump pad groups, each having a plurality of bump pads, and a plurality of opening regions formed between adjacent of the plurality of bump pad groups;

a third metal layer disposed in the peripheral region, having a position corresponding to the plurality of opening regions, and electrically connected to the second metal layer;

a second substrate opposite to the first substrate;

a light shielding layer disposed on the second substrate;

a first color resist layer disposed on the light shielding layer;

a second planarization layer disposed on the second substrate, and covering the first color resist layer; and a second color resist layer disposed on the second substrate;

wherein in the display region, the second color resist layer is adjacent to the first color resist layer, and in the peripheral region, the second color resist layer and the first color resist layer are stacked, and a position of the second color resist layer corresponds to the plurality of opening regions of the first planarization layer.

2. The display device according to claim 1, wherein the first color resist layer has a first thickness, the second color resist layer has a second thickness, and in the peripheral region, the first thickness is greater than the second thickness.

3. The display device according to claim 2, wherein the plurality of bump pads have a third thickness, the third metal layer has a fourth thickness, and the second thickness is equal to a difference between the third thickness and the fourth thickness.

4. The display device according to claim 1, wherein,
the plurality of opening regions have a first opening region, a second opening region and a third opening region;
the first opening region has a first width, the second opening region has a second width, and the third opening region has a third width;
wherein the first width, the second width and the third width have a same width.

5. The display device according to claim 1, wherein,
the plurality of opening regions have a first opening region, a second opening region and a third opening region;
the first opening region has a first width, the second opening region has a second width, and the third opening region has a third width;
wherein the first width is less than the second width, and the second width is less than the third width.

6. The display device according to claim 4, wherein the first width is less than or equal to 100 µm.

7. The display device according to claim 5, wherein the first width is less than or equal to 100 µm.

8. The display device according to claim 1, further comprising:
a plurality of first bump structures disposed on the second planarization layer, and having a position corresponding to the bump pads; and
a plurality of second bump structures disposed on the second planarization layer, and having a position corresponding to the third metal layer.

9. The display device according to claim 8, wherein,
a vertical projection of the plurality of first bump structures or the plurality of second bump structures on the second substrate is a circle.

10. The display device according to claim 9, wherein in the peripheral region, a vertical projection of the first color resist layer or the second color resist layer on the second substrate is a circle or a square.

11. A display device, comprising:
a first substrate having a peripheral region and a display region adjacent to each other, a plurality of pixel units disposed in the display region, arranged into multiple columns along a first direction, and arranged into multiple rows along a second direction, each of the pixel units having a thin film transistor;
a first planarization layer disposed on the first substrate, wherein the first planarization layer includes a plurality of bump pad groups, each having a plurality of bump pads, and a plurality of opening regions formed between adjacent of the plurality of bump pad groups;
a first fan out structure disposed in the peripheral region, formed by stacking of a second metal layer and a third metal layer, and having a position corresponding to the plurality of opening regions;
a second fan out structure disposed in the peripheral region, formed of the second metal layer, and disposed between adjacent of the plurality of opening regions;
a second substrate opposite to the first substrate;
a light shielding layer disposed on the second substrate;
a plurality of first spacing structures disposed on the second substrate, each having a first color resist layer, a second color resist layer and a first bump structure stacked, and having a position corresponding to the first fan out structure; and
a plurality of second spacing structures disposed on the second substrate, each having a first color resist layer and a second bump structure stacked, and having a position corresponding to the second fan out structure.

12. The display device according to claim 11, wherein the first color resist layer has a first thickness, the second color resist layer has a second thickness, and the first thickness is greater than the second thickness.

13. The display device according to claim 12, wherein the plurality of bump pads have a third thickness, the third metal layer has a fourth thickness, and the second thickness is equal to a difference between the third thickness and the fourth thickness.

14. The display device according to claim 11, wherein,
the plurality of opening regions have a first opening region, a second opening region and a third opening region;
the first opening region has a first width, the second opening region has a second width, and the third opening region has a third width;
wherein the first width, the second width and the third width have a same width.

15. The display device according to claim 11, wherein,
the plurality of opening regions have a first opening region, a second opening region and a third opening region;
the first opening region has a first width, the second opening region has a second width, and the third opening region has a third width;
wherein the first width is less than the second width, and the second width is less than the third width.

16. The display device according to claim 14, wherein the first width is less than or equal to 100 µm.

17. The display device according to claim 15, wherein the first width is less than or equal to 100 µm.

18. The display device according to claim 11, wherein,
a vertical projection of the plurality of first bump structures or the plurality of second bump structures on the second substrate is a circle.

19. The display device according to claim 18, wherein a vertical projection of the first color resist layer or the second color resist layer on the second substrate is a circle or a square.

* * * * *